United States Patent
Schmitz et al.

(10) Patent No.: US 12,398,751 B2
(45) Date of Patent: Aug. 26, 2025

(54) OPTIMIZED BALL BEARING AND METHOD OF DESIGNING AN OPTIMIZED BALL BEARING

(71) Applicant: AKTIEBOLAGET SKF, Gothenburg (SE)

(72) Inventors: Tom Schmitz, Hambach (DE); Kyle J. Monaghan, Plymouth, MI (US)

(73) Assignee: AKTIEBOLAGET SKF, Gothenburg (SE)

( * ) Notice: Subject to any disclaimer, the term of this patent is extended or adjusted under 35 U.S.C. 154(b) by 306 days.

(21) Appl. No.: 18/327,248

(22) Filed: Jun. 1, 2023

(65) Prior Publication Data

US 2024/0405632 A1    Dec. 5, 2024

(51) Int. Cl.
| | |
|---|---|
| *F16C 19/06* | (2006.01) |
| *F16C 33/32* | (2006.01) |
| *G06F 30/17* | (2020.01) |
| *H02K 5/173* | (2006.01) |

(52) U.S. Cl.
CPC .......... *H02K 5/1732* (2013.01); *F16C 19/06* (2013.01); *G06F 30/17* (2020.01); *F16C 2240/70* (2013.01); *F16C 2380/26* (2013.01); *H02K 2213/03* (2013.01)

(58) Field of Classification Search
CPC ........ F16C 19/06; F16C 33/303; F16C 33/32; F16C 2240/82; F16C 2380/26; H02K 5/1732

See application file for complete search history.

(56) References Cited

U.S. PATENT DOCUMENTS

| | | | | |
|---|---|---|---|---|
| 6,481,898 | B1 * | 11/2002 | Yakura | F16C 33/303 |
| | | | | 384/450 |
| 10,781,857 | B2 * | 9/2020 | Sishtla | F16C 19/163 |

FOREIGN PATENT DOCUMENTS

| | | | | |
|---|---|---|---|---|
| CN | 103958910 A | * | 7/2014 | ............. F03D 3/005 |
| DE | 19982586 B4 | * | 2/2005 | ............. F16C 33/30 |
| JP | H07110029 A | * | 4/1995 | |

* cited by examiner

*Primary Examiner* — Phillip A Johnson
(74) *Attorney, Agent, or Firm* — J-TEK LAW PLLC; Scott T. Wakeman; Mark A. Ussai

(57) ABSTRACT

A method of designing a ball bearing includes providing a value of a shaft outside diameter and a load. An inside diameter of a bearing inner ring is determined based on the value of the shaft outside diameter. A ball size having a specific ball diameter is selected and a number of the balls of the selected standard ball size required to support the load is determined. A pitch diameter of a pitch circle of the ball bearing is determined based on the determined number of balls of the selected ball size. A suitability factor is calculated for the particular value of the pitch diameter and the particular pitch diameter is validated as suitable when the suitability factor is between calculated upper and lower limits.

20 Claims, 5 Drawing Sheets

OPTIMIZED BALL BEARING AND METHOD OF DESIGNING AN OPTIMIZED BALL BEARING

BACKGROUND OF THE INVENTION

The present invention relates to bearings, and more particularly to ball bearings.

Ball bearings are well known and include at least an inner ring with an inner raceway, an outer ring with an outer raceway and a plurality of balls disposed between the two rings and rolling simultaneously upon the inner and outer raceways. The selection of a ball bearing for a particular application is generally based upon providing a shaft diameter onto which the bearing is installed and an amount of loading to be supported by the bearing. Then, an appropriate bearing size is selected from among one of typically several commercially available ball bearings which are capable of fitting on the designated shaft size and supporting the indicated load.

Although such a ball bearing selection process has proven quite effective since the inception of the ball bearing industry, this process often results in the utilization of a bearing that is larger and heavier than is actually required to support the designated load. Particularly with applications such as electric vehicles, there is a motivation to reduce size and weight of various mechanical components in order to reduce energy consumption.

SUMMARY OF THE INVENTION

In one aspect, the present invention is a ball bearing for an electric vehicle, the ball bearing supporting a load applied to a shaft of an electric motor of the vehicle. The ball bearing comprises an inner ring having a centerline and an inside diameter, the inside diameter being sized such that the inner ring fits upon the shaft of the electric motor and an outer ring is disposed about the inner ring. A number of balls are disposed between the inner ring and the outer ring and traverse a pitch circle extending about the centerline, each ball having a ball diameter and the pitch circle having a pitch diameter. The number of balls and the ball diameter are selected to provide a value of the pitch diameter which satisfies the following equations:

$$X = \pi^2 * BD^2 * PD * ID; \text{ where } LL \leq X \leq UL;$$
$$UL = (-2.4815 * ID^3) + (211.6 * ID^2) - (4568.1 * ID) + 38956; \text{ and}$$
$$LL = (-23.511 * ID^2) + (2235.9 * ID) - 2856;$$

wherein X is a suitability factor, BD is the ball diameter, PD is the pitch diameter, ID is the inside diameter of the inner ring, LL is a lower limit and UL is an upper limit.

In another aspect, the present invention is an electric motor assembly for an electric passenger vehicle, the electric motor assembly comprising an electric motor stator enclosed within a housing, an electric motor rotor disposed at least partially within the stator, and an output shaft connected with the rotor. At least one ball bearing configured to support loading on the motor output shaft, the ball bearing including an inner ring having a centerline and an inside diameter, the inside diameter being sized such that the inner ring fits upon the shaft of the electric motor, and an outer ring disposed about the inner ring. A number of balls are disposed between the inner ring and the outer ring and traverse a pitch circle extending about the centerline, each ball having a ball diameter and the pitch circle having a pitch diameter. The number of balls and the ball diameter are selected to provide a value of the pitch diameter which satisfies the following equations:

$$X = \pi^2 * BD^2 * PD * ID; \text{ where } LL \leq X \leq UL;$$
$$UL = (-2.4815 * ID^3) + (211.6 * ID^2) - (4568.1 * ID) + 38956; \text{ and}$$
$$LL = (-23.511 * ID^2) + (2235.9 * ID) - 2856;$$

wherein X is a suitability factor, BD is the ball diameter, PD is the pitch diameter, ID is the inside diameter of the inner ring, LL is a lower limit and LL is an upper limit.

In a further aspect, the present invention is a method of designing a ball bearing to support a predetermined load on a shaft, the method comprising the steps of:
providing a value of an outside diameter of the shaft and a value of the load;
determining an inside diameter ID of a bearing inner ring based on the value of the shaft outside diameter;
selecting a ball size having a specific ball diameter BD;
determining a number N of the balls of the selected standard ball size required to support the load;
determining a pitch diameter PD of a pitch circle of the ball bearing based on the determined number of balls of the selected ball size; and
calculating a suitability factor X using the following equation:

$$X = \pi^2 * BD^2 * PD * ID;$$

and
validating the pitch diameter as suitable for the ball bearing when the suitability factor is between an upper limit UL and a lower limit LL, the upper limit and lower limit being calculated as follows:

$$UL = (-2.4815 * ID^3) + (211.6 * ID^2) - (4568.1 * ID) + 38956; \text{ and}$$
$$LL = (-23.511 * ID^2) + (2235.9 * ID) - 28567.$$

BRIEF DESCRIPTION OF THE SEVERAL VIEWS OF THE DRAWINGS

The foregoing summary, as well as the detailed description of the preferred embodiments of the present invention, will be better understood when read in conjunction with the appended drawings. For the purpose of illustrating the invention, there is shown in the drawings, which are diagrammatic, embodiments that are presently preferred. It should be understood, however, that the present invention is not limited to the precise arrangements and instrumentalities shown. In the drawings.

DETAILED DESCRIPTION OF THE INVENTION

Figure 5:
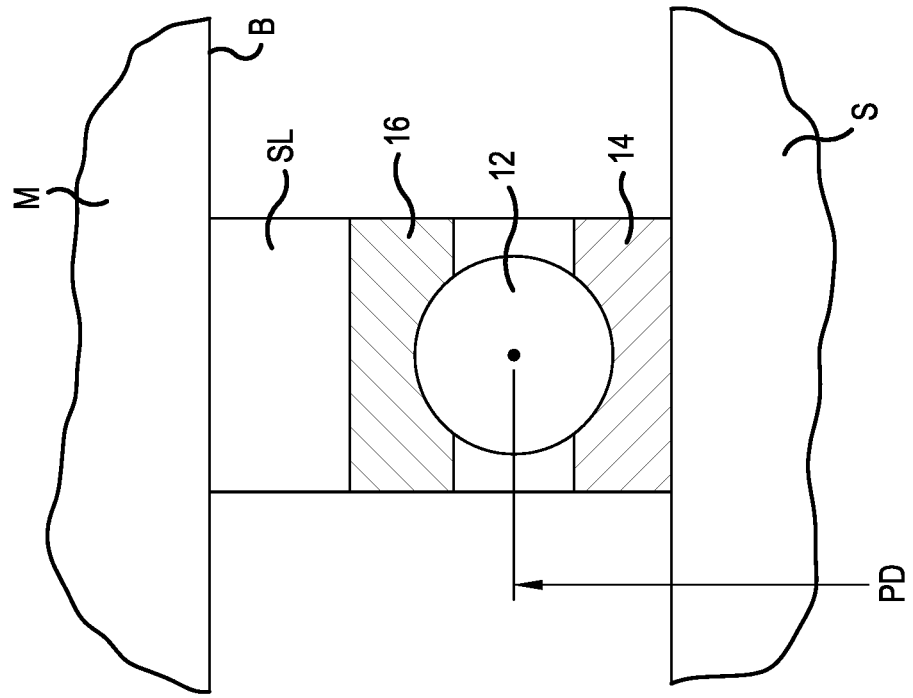
FIG. 5 is an axial cross-sectional view of an optimized ball bearing, showing an adapter sleeve for fitting the bearing within a conventionally sized bore of a housing.
Figure 4:
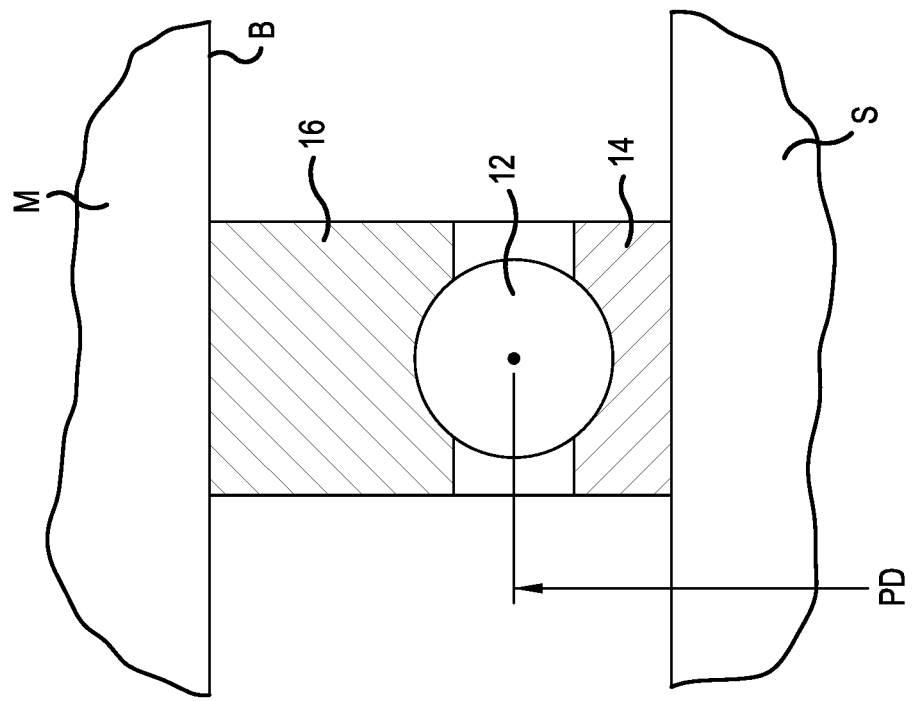
FIG. 4 is an axial cross-sectional view of an alternative optimized ball bearing, showing an outer ring sized to fit within a conventionally sized bore of a housing.
Figure 6:
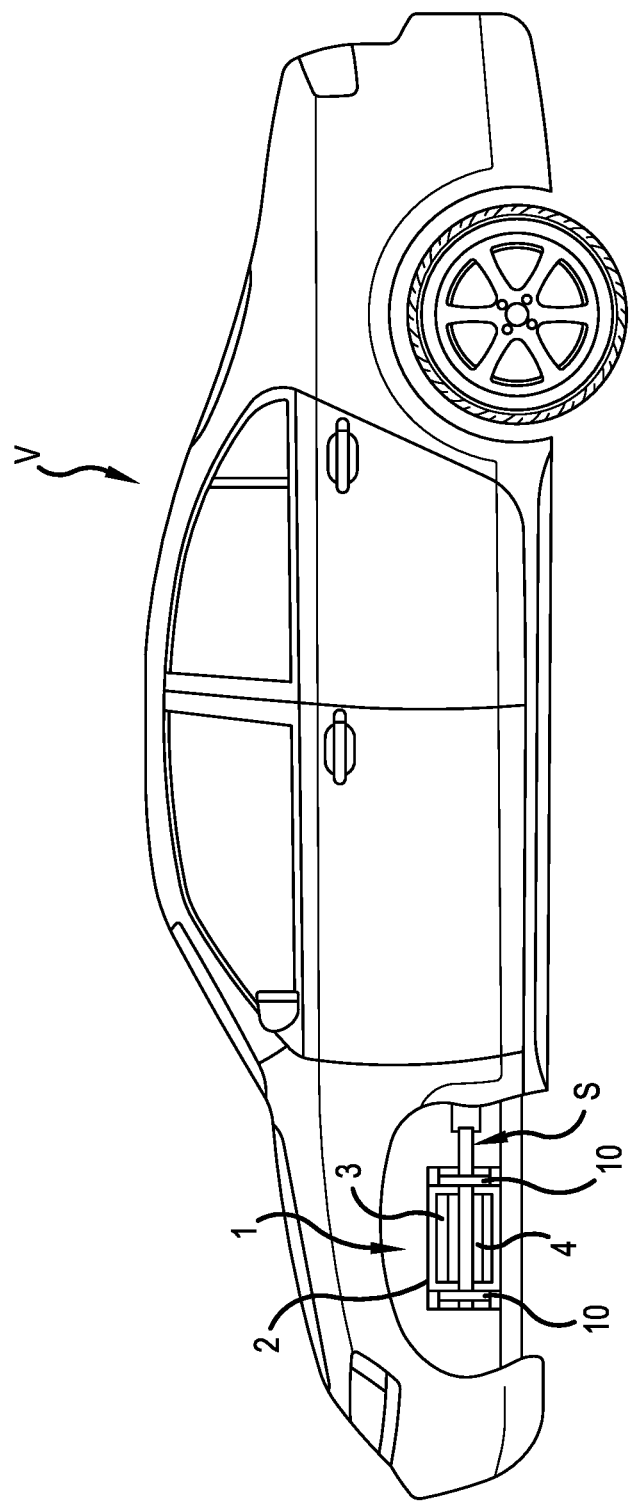
FIG. 6 is partly broken-away, more diagrammatic view of an electric vehicle and an electric motor incorporating the bearing of the present invention.

Referring now to the drawings in detail, wherein like numbers are used to indicate like elements throughout, there is shown in FIGS. 1-6 a ball bearing 10 for supporting a load L applied to a shaft S. The load L has a predetermined value and may be radial, axial, a moment or any combination thereof and the shaft S has an outside diameter $OD_S$. The bearing 10 is preferably for an electric vehicle V, specifically for supporting a load L applied to an output shaft S of an electric motor 1 of the vehicle V, the shaft S being rotatable about a central axis $A_C$. More specifically, the ball bearing 10 is preferably disposed within a housing 2 which encloses an electric motor stator 3 disposed about an electric motor rotor 4 mounted on the shaft S, with two of the bearings 10 each located adjacent to a separate axial end of the rotor 4, as shown in FIG. 6. The ball bearing 10 is formed in accordance with a method of the present invention, as described in detail below, in which the bearing 10 has been designed to optimize the use of materials of the bearing 10, in particular the number and size of the balls 12 required to support the load L and positioning the balls 12 on a pitch circle PC which is typically "smaller", i.e., having a lesser value of the pitch diameter PD, in comparison with prior art design principles. Specifically, the ball bearing 10 is formed having a selected inner ring inside diameter ID, a determined number N of the balls 12 of a specific diameter BD so as to provide an optimized pitch diameter PD which satisfies the following equations:

$$X = \pi^2 * BD^2 * PD * ID; \text{ where } LL \le X \le UL;$$

$$UL = (-2.4815 * ID^3) + (211.6 * ID^2) - (4568.1 * ID) + 38956; \text{ and}$$

$$LL = (-23.511 * ID^2) + (2235.9 * ID) - 2856;$$

wherein X is a suitability factor, LL is a lower limit and UL is an upper limit, as described in further detail below.

Basically, the ball bearing 10 comprises an inner ring 14 and an outer ring 16 disposed about the inner ring 14 and an optimized number N of the balls 12. The inner ring 14 has a centerline CL (FIG. 2), which is coaxial with the shaft axis $A_C$, an inner circumferential surface 15A with an inside diameter ID, an opposing outer circumferential surface 15B with an outside diameter (not indicated), an inner raceway 18 extending inwardly from the outer surface 15B and having an inner track diameter $TD_I$ at a central position on the inner raceway 18, and an axial length $LA_I$ between opposing axial ends 14a, 14b. Preferably, the inside diameter ID is sized approximately equal to the designated outside diameter ODS of the shaft, but is preferably reduced by the desired amount of interference between the inner ring 14 and the shaft S. The outer ring 16 has an outer circumferential surface 17A with an outside diameter OD, an inner circumferential surface 17B with an inside diameter (not indicated), an outer raceway 20 extending outwardly from the inner surface 17B and having an outer track diameter $TD_O$ at a central position on the outer raceway 20, and an axial length $LA_O$ between opposing axial ends 16a, 16b.

Further, in the preferred application of an electric vehicle V, the balls 12 are preferably fabricated of a ceramic material, but may be made any other appropriate material for other applications, such as bearing steel, etc. The number N of balls 12 is determined or calculated to provide only the amount/number of balls 12 required to support the specified load L, with a factor of safety (i.e., the balls 12 will support loads exceeding the specified load L by a certain amount to avoid failure). As such, the bearing 10 is designed with a minimal acceptable number N of the balls 12 that will both provide the required load L support and enable other dimensions of the bearing 10 to be sufficiently sized to provide the required strength and structural integrity of the ball bearing 10.

More specifically, the balls 12 have a specific ball diameter BD and are preferably selected from among a plurality of standard ball sizes, each standard ball size having a ball diameter with a value different than the value of the ball diameter of each other standard ball size. Each ball 12 of a particular standard size is known to have a certain "load capacity" or the capability of safely supporting up to a certain amount of loading. Also, a larger ball formed of a given material (e.g., bearing steel, ceramic, etc.) has the capacity to support a greater load than a smaller ball formed of the same material, and vice-versa. However, the balls 12 may alternatively be specifically manufactured for the bearing 10 and may each have a non-standard ball diameter BD.

In either case, once a particular ball size with a specified ball diameter BD has been selected, the number N of the balls 12 required to support the specified load L may be determined by dividing the load L by the load capacity of each ball 12 of the selected ball size. That is:

Number of balls(N)=Load(L)/Ball Load Capacity

Once the number N of the balls 12 is calculated or determined, the circumference of the pitch circle PC, the theoretical circle extending through the center of each ball 12 as the balls 12 circulate between the inner ring 14 and the outer ring 16, may be determined. Specifically, the circumference CP of the pitch circle PC is calculated by multiplying the determined number N of the balls 12 by the ball diameter BD, or:

$$CP = N * BD$$

As there is typically a desired spacing distance SD between each pair of two adjacent balls 12, which is typically established or maintained by a ball cage (not shown), the circumference CP of the pitch circle PC spacing may be more accurately calculated as follows:

$$CP = (N * BD) + (N * SD)$$

Next, having determined the circumference CP of the pitch circle PC, the diameter of the pitch circle or the "pitch diameter" PD may be calculated by dividing the calculated value of the circumference CP of the pitch circle PC by the value of the mathematical constant of pi or "π", as is known under basic geometric principles. The calculation of the pitch diameter may be expressed by the following equation:

$$PD = CP/\pi = (N*BD)/\pi$$

or, accounting for the spacing distance SD between the balls 12, the pitch diameter PD may instead be calculated as follows:

$$PD = CP/\pi = [(N*BD) + (N*SD)]/\pi$$

Once the pitch diameter PD for the required number N of the balls 12 of the selected ball size is known, the appropriateness or "suitability" of a specific value of the pitch diameter PD is determined by calculating a "suitability factor" X for the calculated pitch diameter PD based on the selected ball size (i.e., ball diameter BD) and the determined inside diameter ID of the inner ring 14. The suitability factor X has been determined to account for various factors of bearing design, such as a minimal required radial thickness of the inner ring 14 between the inner raceway 18 and the inner circumferential surface 15A for a particular inner ring inside diameter ID, a minimum axial length $LA_I$ of the inner ring 14 for a particular ball diameter BD and inner ring inside diameter ID, etc. Utilizing these and other factors, a detailed discussion of which is beyond the scope of the present disclosure, the suitability factor X is expressed by the following equation:

$$X = \pi^2 * BD^2 * PD * ID$$

Further, a particular value of the pitch diameter PD, calculated or derived as discussed above, has been determined to be acceptable or "validated" when the value of the suitability factor X is between an upper limit UL and a lower limit LL which are calculated as follows:

$$UL = \left(-2.4815*ID^3\right) + \left(211.6*ID^2\right) - (4568.1*ID) + 38956; \text{ and}$$

$$LL = \left(-23.511*ID^2\right) + (2235.9*ID) - 28567.$$

As such, when a particular value of the pitch diameter PD, which is based upon a selected ball size, i.e., the ball diameter BD, is validated or found to be acceptable using the suitability factor X, the remaining dimensions of the ball bearing 10 may be designed or devised based upon an available envelope or space for the bearing 10 between the shaft S and an outer member M (e.g., a housing, a hub, etc.) and other conventional bearing design factors. Such dimensions include values for the inside track diameter $TD_I$, the outside track diameter $TD_O$, the axial length $LA_I$, $LA_O$ of the inner and outer rings 14, 16, the outside diameter OD of the outer ring 16, etc. In any case, at least one ball bearing 10 having the validated pitch diameter PD, the selected ball diameter BD and the determined number N of the balls 12, and the other calculated bearing dimensions discussed above and in further detail below, is preferably manufactured.

More specifically, the inner track diameter $TD_I$ of the inner raceway 18 of the inner ring 14 is calculated by subtracting the specific ball diameter BD from the pitch diameter PD. Similarly, the outer track diameter $TD_I$ of the outer raceway 20 of the outer ring 16 may be calculated by adding the specific ball diameter BD from the pitch diameter PD. Also, the axial length $LA_I$ of the inner ring 14 may be calculated as the sum of the ball diameter BD and twice a value of a desired shoulder axial length (not indicated) and the axial length $LA_O$ of the outer ring 16 is calculated as the sum of the ball diameter BD and twice a value of a desired shoulder axial length (not indicated). Preferably, the axial lengths of the inner and outer rings 14, 16 are equal, so as to provide a common bearing axial length SLB, but may alternatively differ from each other in certain applications.

Figure 1:
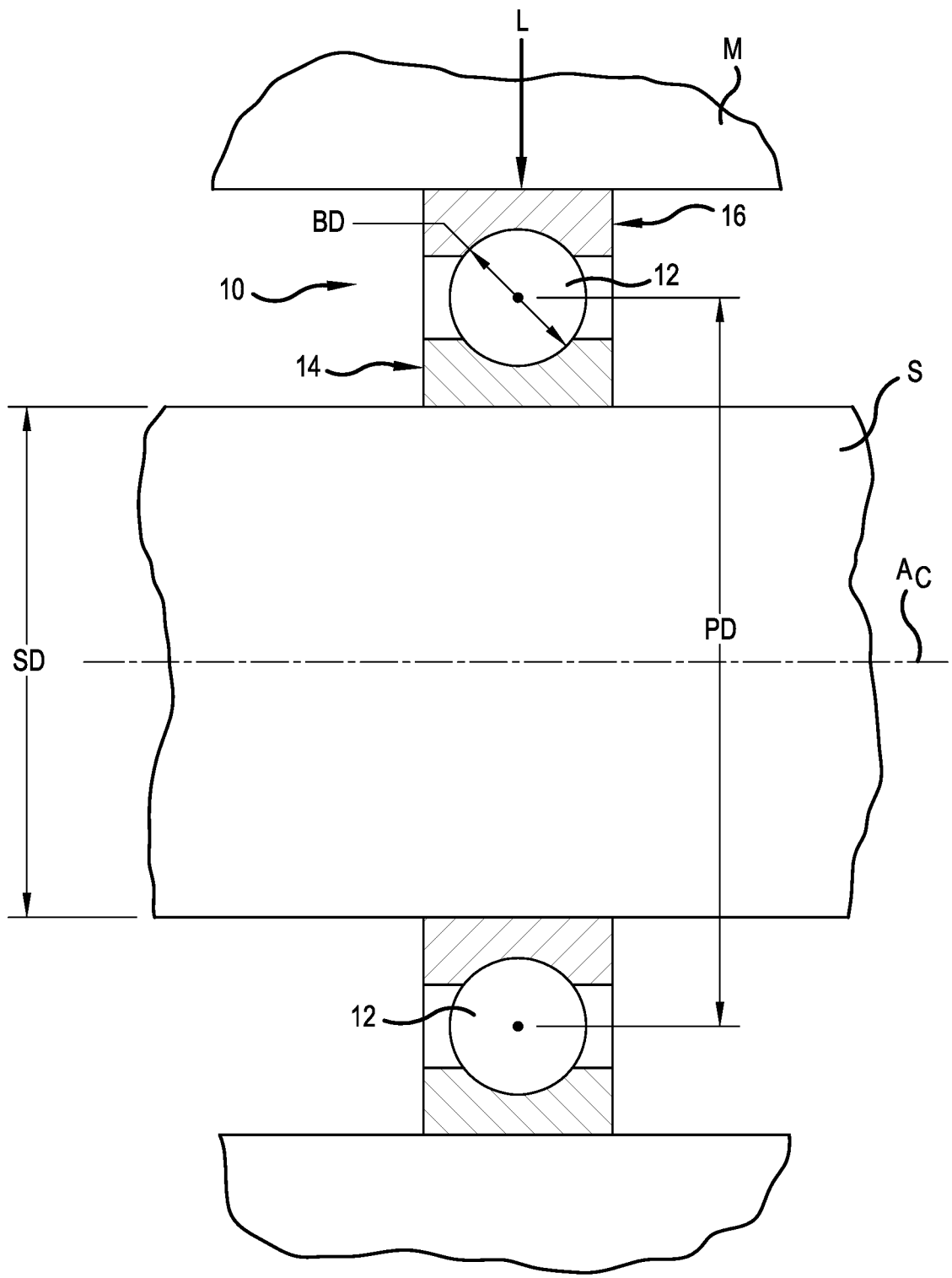
FIG. 1 is an axial cross-sectional view of a ball bearing optimized in accordance with the present invention.
Figure 2:
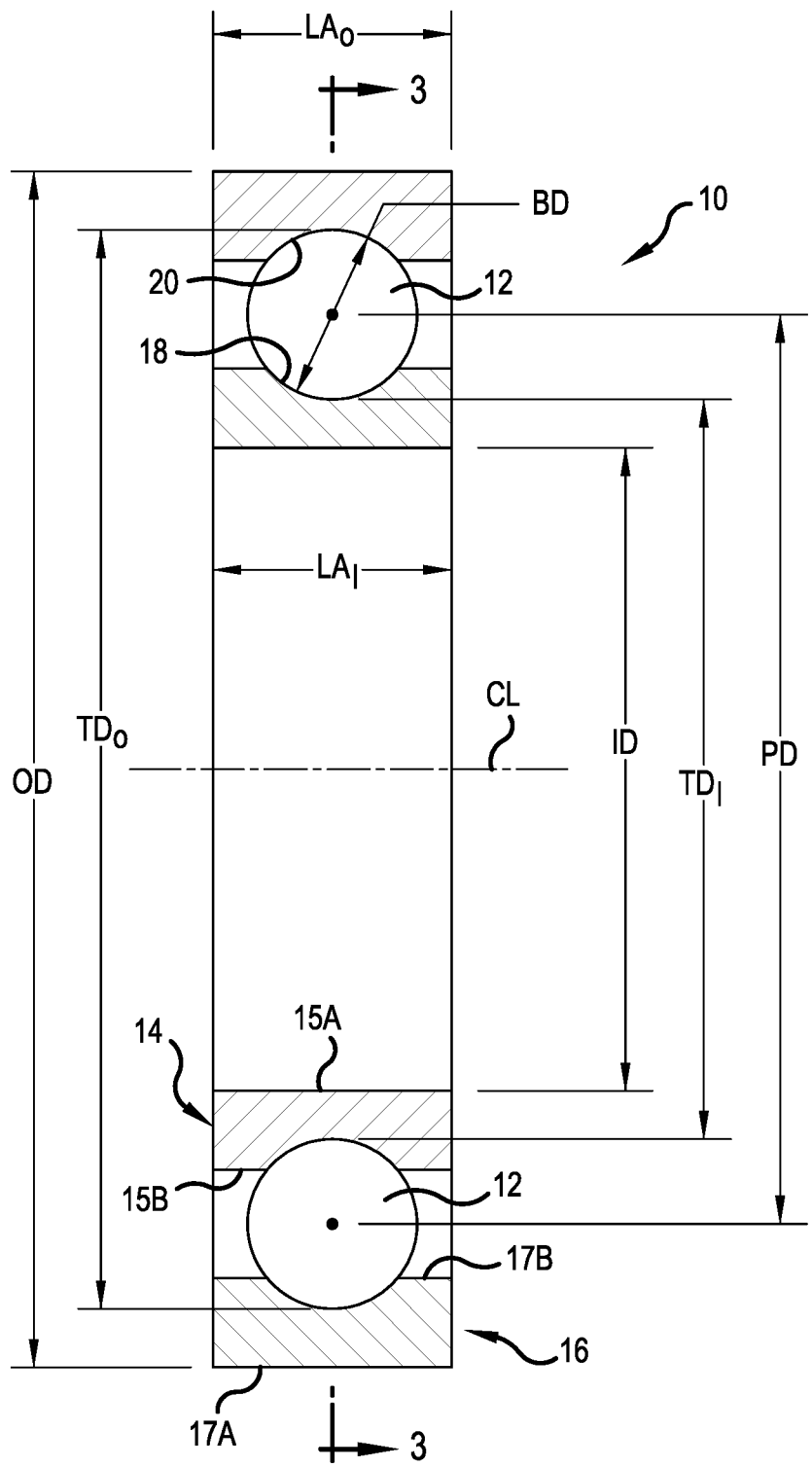
FIG. 2 is an enlarged view of an upper portion of FIG. 1.
Figure 3:
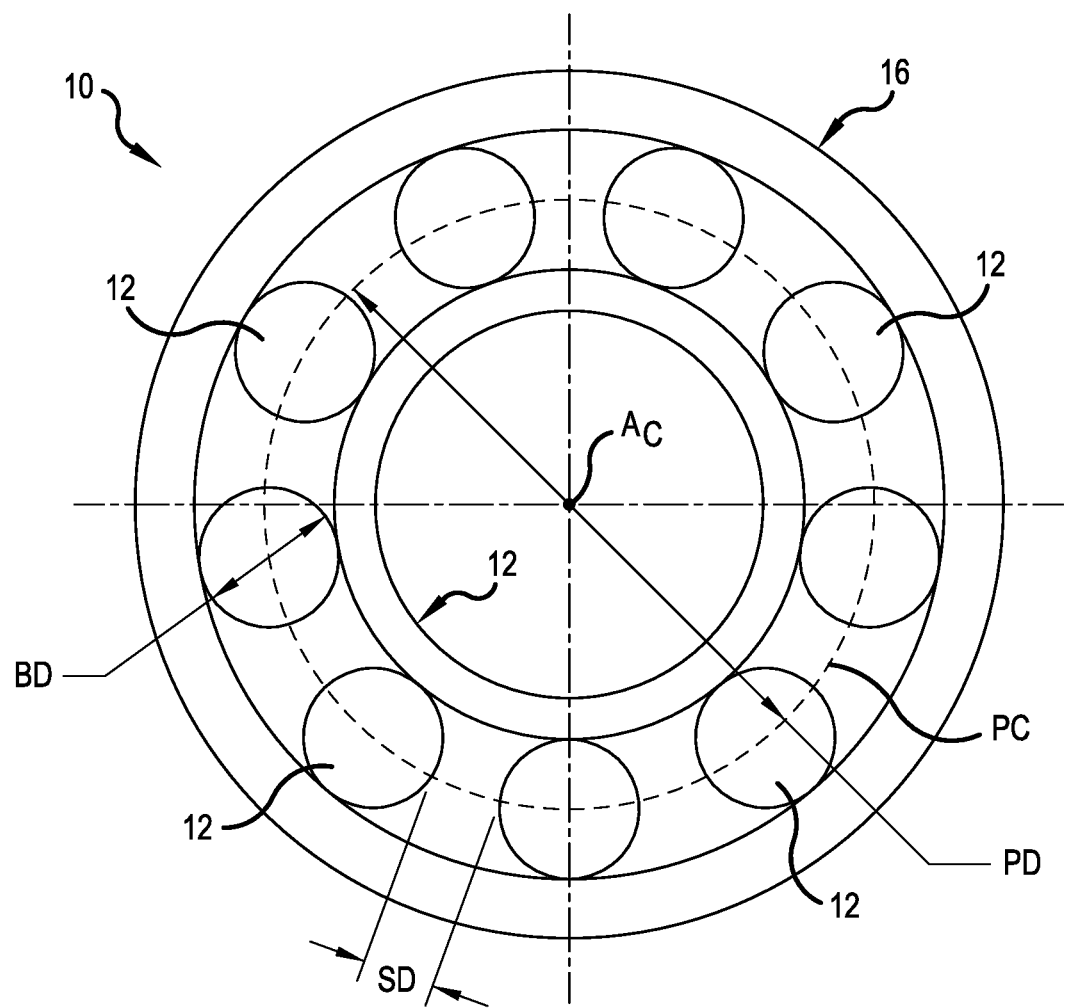
FIG. 3 is a view through line 3-3 of FIG. 2.

Further, the outside diameter OD of the outer ring 16 may have a value of an outside diameter of a commercially available bearing, specifically of such a bearing with an inner ring having inside diameter equal to the determined inner ring inside diameter ID, as shown in FIG. 3. Such an overall sizing of the bearing 10 may be appropriate when a customer has already formed an opening or bore B for the bearing 10 based on conventional bearing design principles. However, the outside diameter OD of the bearing outer ring 16 preferably has a value of less than the outside diameter of the commercially available bearing and greater than a sum of the pitch diameter PD and the ball diameter OD, as shown in FIG. 1. In other words, the outside diameter OD is greater than the value of the outer track diameter $TD_O$ by an appropriate radial thickness between the outer raceway 20 and the outer circumferential surface 17A of the bearing outer ring 16.

The second approach for determining the outer ring outside diameter OD, as described above, takes advantage of a primary benefit of the present invention, which is a reduced overall bearing size due to calculating and implementing a pitch diameter PD which is substantially reduced from the typical pitch diameter of prior art commercial bearings. Not only does such a reduced bearing ring outside diameter OD reduce the weight of the bearing outer ring 16, which is typically formed of a relatively heavy bearing steel, the reduced size enables a corresponding increase of the material of the housing or hub into which the outer ring 16 is installed, which may be formed of a substantially lighter material such as aluminum or even a rigid polymeric material. Further, even if the optimized bearing 10 is installed within an existing bore B or hole sized by a conventional bearing selection process, an annular sleeve SL of a lightweight material (e.g., aluminum) may be provided to fill the space between a reduced size outer ring 16 and the existing bore/hole, as shown in FIG. 5.

However, if the pitch diameter PD determined for the selected ball size (i.e., ball diameter BD) is found unsuitable or invalid by the calculations discussed above, or even when the validated, another standard ball size having another specific ball diameter BD2 may be selected. Preferably, the other ball diameter BD2 is selected from among the plurality of standard ball sizes, but may alternatively be selected or specified with a non-standard ball diameter BD2. Then, the number N2 of the balls 12 of the other ball size required to support the load L is determined and another pitch diameter PD2 of an alternative pitch circle PC2 of the ball bearing 10, based on the determined number N2 of the balls 12 of the other standard ball size, is calculated as described above. Next, another suitability factor X2 may be derived using the following equation:

$$X2 = \pi^2 * BD2^2 * PD2 * ID$$

Finally, the other pitch diameter PD2 is validated as suitable for the ball bearing 10 when the other suitability factor X2 has a value between the upper limit UL and the lower limit LL as described above, the limits UL, LL being based solely on the selected inner ring inside diameter ID and is thus the same for all pitch diameters in a particular design application.

The process of selecting a specific ball size and calculating a pitch diameter PD based on the ball diameter BD, the determined inner ring inside diameter ID and the applied load L may be repeated for as many different ball diameters BD (i.e., standard ball sizes) as desired by the particular designer of the ball bearing 10. Then, the ball bearing designer may select one of the specific validated pitch diameters PD, PD2, etc. and the associated ball diameter BD, BD2, etc., and then calculate or select the remaining dimensions of the ball bearing 10 as described above or as known from conventional bearing design factors. The selection of the specific ball diameter and pitch diameter combination may be based upon which design results in the lowest friction as determined by an appropriate simulation tool.

Further, as the design process is preferably iterative for a number of different ball sizes/diameters BD and well as involving various bearing dimensions based upon a calculated pitch diameter PD, the process is preferably automated through the use of an appropriate software program or other computerized means. In other words, a computer software program is preferably provided which is configured to receive the value of the shaft outside diameter ODs and the value of the load L as inputs. The program is configured to perform the steps of selecting the inside diameter ID of the bearing inner ring 14, selecting one standard ball size/diameter BD, determining the number N of the balls 12, calculating the pitch diameter PD, calculating an acceptability factor X and then validating the calculated pitch diameter PD. The software program then provides at least one validated pitch diameter PD as an output, and most preferably provides a plurality of validated pitch diameters PD, PD2, etc. as well as other bearing dimensions corresponding to each validated pitch diameter PD, such as the inner ring inside diameter ID, the bearing axial length LA, a recommended outer ring outside diameter OD, etc. The software program may also determine which combination of the various bearing dimensions results in the least amount of friction.

The bearing design process of the present invention results in a ball bearing 10 that has a reduced pitch diameter PD and which utilizes balls 12 with a smaller ball diameter BD, thus enabling a reduction in both the axial length LA of the bearing 10 and the outside diameter of the bearing 10, i.e., the bearing outer ring outside diameter OD. Such a reduction in overall bearing size reduces the weight of the assembly into which the bearing 10 is installed, and therefore a reduced energy consumption, and typically also leads to reduced friction within the bearing 10 in comparison with a bearing selected for a particular application under previously known bearing selection processes.

Representative, non-limiting examples of the present invention were described above in detail with reference to the attached drawings. This detailed description is merely intended to teach a person of skill in the art further details for practicing preferred aspects of the present teachings and is not intended to limit the scope of the invention.

Moreover, combinations of features and steps disclosed in the above detailed description may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter. The invention is not restricted to the above-described embodiments, and may be varied within the scope of the following claims.

We claim:

1. A ball bearing for an electric vehicle, the ball bearing supporting a load applied to a shaft of an electric motor of the vehicle, the ball bearing comprising:
    an inner ring having a centerline and an inside diameter, the inside diameter being sized such that the inner ring fits upon the shaft of the electric motor;
    an outer ring disposed about the inner ring; and
    a number of balls disposed between the inner ring and the outer ring and traversing a pitch circle extending about the centerline, each ball having a ball diameter and the pitch circle having a pitch diameter, the number of balls and the ball diameter being selected to provide a value of the pitch diameter which satisfies the following equations:

$$X = \pi^2 * BD^2 * PD * ID; \text{ where } LL \leq X \leq UL;$$

$$UL = (-2.4815 * ID^3) + (211.6 * ID^2) - (4568.1 * ID) + 38956; \text{ and}$$

$$LL = (-23.511 * ID^2) + (2235.9 * ID) - 2856;$$

wherein X is a suitability factor, BD is the ball diameter, PD is the pitch diameter, ID is the inside diameter of the inner ring, LL is a lower limit and UL is an upper limit.

2. The ball bearing as recited in claim 1, wherein:
    each ball is formed of ceramic and the value of the ball diameter is between three millimeters (3 mm) and six millimeters (6 mm); and
    the inside diameter of the inner ring has a value between twenty millimeters (20 mm) and sixty millimeters (60 mm).

3. The ball bearing as recited in claim 1, wherein each ball is formed of ceramic and the value of the ball diameter is between three millimeters (3 mm) and six millimeters (6 mm).

4. The ball bearing as recited in claim 1, wherein the inside diameter of the inner ring has a value between twenty millimeters (20 mm) and sixty millimeters (60 mm).

5. The ball bearing as recited in claim 1, wherein the inner ring has an outer circumferential surface and an inner raceway extending radially inwardly from the outer surface, the outer ring has an inner circumferential surface and an outer raceway extending radially outwardly from the inner surface, and the inner raceway and the outer raceway are each formed as a deep groove of a deep groove ball bearing.

6. An electric motor assembly for an electric passenger vehicle, the electric motor assembly comprising:
- an electric motor stator enclosed within a housing;
- an electric motor rotor disposed at least partially within the stator;
- an output shaft connected with the rotor; and
- at least one ball bearing configured to support loading on the motor output shaft, the ball bearing including:
  - an inner ring having a centerline and an inside diameter, the inside diameter being sized such that the inner ring fits upon the shaft of the electric motor;
  - an outer ring disposed about the inner ring; and
  - a number of balls disposed between the inner ring and the outer ring and traversing a pitch circle extending about the centerline, each ball having a ball diameter and the pitch circle having a pitch diameter, the number of balls and the ball diameter being selected to provide a value of the pitch diameter which satisfies the following equations:

$$X = \pi^2 * BD^2 * PD * ID; \text{ where } LL \leq X \leq UL;$$

$$UL = (-2.4815 * ID^3) + (211.6 * ID^2) - (4568.1 * ID) + 38956; \text{ and}$$

$$LL = (-23.511 * ID^2) + (2235.9 * ID) - 2856;$$

wherein X is a suitability factor, BD is the ball diameter, PD is the pitch diameter, ID is the inside diameter of the inner ring, LL is a lower limit and UL is an upper limit.

7. The electric motor assembly as recited in claim 6, wherein the at least one ball bearing is disposed within the motor housing and located adjacent to the rotor.

8. The electric motor assembly as recited in claim 6, wherein:
- each ball of the ball bearing is formed of ceramic and the value of the ball diameter is between three millimeters (3 mm) and six millimeters (6 mm); and
- the inside diameter of the inner ring of the bearing has a value between twenty millimeters (20 mm) and sixty millimeters (60 mm).

9. The electric motor assembly as recited in claim 6, wherein the inner ring of the bearing has an outer circumferential surface and an inner raceway extending radially inwardly from the outer surface, the outer ring of the at least one bearing has an inner circumferential surface and an outer raceway extending radially outwardly from the inner surface, and the inner raceway and the outer raceway are each formed as a deep groove of a deep groove ball bearing.

10. A method of designing a ball bearing to support a predetermined load on a shaft, the method comprising the steps of:
- providing a value of an outside diameter of the shaft and a value of the load;
- determining an inside diameter (ID) of a bearing inner ring based on the value of the shaft outside diameter;
- selecting a ball size having a specific ball diameter (BD);
- determining a number (N) of the balls of the selected ball size required to support the load;
- determining a pitch diameter (PD) of a pitch circle of the ball bearing based on the determined number of balls of the selected ball size; and
- calculating a suitability factor (X) using the following equation:

$$X = \pi^2 * BD^2 * PD * ID;$$

and
- validating the pitch diameter as suitable for the ball bearing when the suitability factor is between an upper limit (UL) and a lower limit (LL), the upper limit and lower limit being calculated as follows:

$$UL = (-2.4815 * ID^3) + (211.6 * ID^2) - (4568.1 * ID) + 38956; \text{ and}$$

$$LL = (-23.511 * ID^2) + (2235.9 * ID) - 28567.$$

11. The method as recited in claim 10, wherein:
- the step of selecting the ball size includes selecting one standard ball size having a specific ball diameter (BD) from a plurality of standard ball sizes, each standard ball size having a ball diameter with a value different than the value of the ball diameter of each other standard ball size; and
- the step of determining the number (N) of the balls includes determining the number of balls of the selected standard ball size required to support the load.

12. The method as recited in claim 11, further comprising the step of fabricating at least one bearing having the pitch diameter, the selected ball diameter and the determined number of balls.

13. The method as recited in claim 11, further comprising the steps of:
- selecting another standard ball size having another specific ball diameter (BD2) from the plurality of standard ball sizes;
- determining a number (N2) of balls of the other standard ball size required to support the load;
- determining another pitch diameter (PD2) of an alternative pitch circle of the ball bearing based on the determined number of balls of the other standard ball size;
- calculating another suitability factor (X2) using the following equation:

$$X2 = \pi^2 * BD2^2 * PD2 * ID;$$

- validating the other pitch diameter as suitable for the ball bearing when the other suitability factor is between the upper limit and the lower limit; and
- selecting between the pitch diameter and the other pitch diameter.

14. The method as recited in claim 10, wherein the step of determining the number of balls includes determining the load capacity of each ball of the specific diameter and dividing the value of the load by the load capacity of each ball.

15. The method as recited in claim 10, wherein the step of determining the pitch diameter includes the substeps of:
- calculating a circumference of the pitch circle by multiplying the determined number of balls by the ball diameter; and
- calculating the pitch diameter by dividing the calculated circumference of the pitch circle by the value of pi($\pi$).

16. The method as recited in claim 15, wherein the substep of calculating the circumference of the pitch circle includes adding a spacing value to the product of the determined number of balls and the ball diameter, the spacing value being calculated by multiplying a desired spacing distance between each pair of adjacent balls by the number of balls.

17. The method as recited in claim 10, further comprising the steps of:
    calculating an inner track diameter of an inner raceway of the inner ring by subtracting the specific ball diameter from the pitch diameter; and
    calculating an outer track diameter of an outer raceway of an outer ring by adding the specific ball diameter to the pitch diameter.

18. The method as recited in claim 10, further comprising the step of determining an outside diameter of an outer ring of the bearing by:
    selecting an outside diameter of a commercially available bearing with an inner ring having inside diameter equal to the determined inner ring inside diameter; or
    determining an outside diameter having a value less than the outside diameter of the commercially available bearing and greater than a sum of the validated pitch diameter and the ball diameter of the selected ball size.

19. The method as recited in claim 10, further comprising the step of determining an axial length of the ball bearing by calculating the sum of the ball diameter and twice a value of a desired shoulder axial length.

20. The method as recited in claim 10, further comprising the step of providing a computer program configured to receive the value of the shaft diameter and the value of the load as inputs, to perform the steps of selecting the inside diameter of the bearing inner ring, selecting one standard ball size, determining the number of balls, calculating the pitch diameter, calculating an acceptability factor and validating the calculated pitch diameter, and to provide a validated pitch diameter as an output.

* * * * *